United States Patent [19]

Takizawa

[11] Patent Number: 5,471,279
[45] Date of Patent: Nov. 28, 1995

[54] APPARATUS AND METHOD FOR SUPPORTING A SUBSTRATE

[75] Inventor: Takeshi Takizawa, Kunitachi, Japan

[73] Assignee: Canon Kabushiki Kaisha, Tokyo, Japan

[21] Appl. No.: 378,878

[22] Filed: Jan. 26, 1995

Related U.S. Application Data

[63] Continuation of Ser. No. 13,088, Feb. 3, 1993, abandoned.

[30] Foreign Application Priority Data

Feb. 10, 1992 [JP] Japan .................................. 4-057512

[51] Int. Cl.$^6$ .................................................. G03B 27/42
[52] U.S. Cl. .................... 355/73; 355/53; 355/91; 355/94; 269/21
[58] Field of Search ........................ 355/53, 73, 91, 355/94; 269/21

[56] References Cited

U.S. PATENT DOCUMENTS

| Re. 30,601 | 5/1981 | Horr et al. | 355/76 |
|---|---|---|---|
| 3,711,081 | 11/1973 | Cachon | 269/21 |
| 4,218,136 | 8/1980 | Komoriya et al. | 355/79 |
| 4,242,038 | 12/1980 | Santini et al. | 414/755 |
| 4,345,836 | 8/1982 | Phillips | 355/53 |
| 5,085,558 | 2/1992 | Engelbrecht | 414/786 |
| 5,160,959 | 11/1992 | Everett et al. | 353/53 |
| 5,191,218 | 3/1993 | Mori et al. | 250/453.11 |

FOREIGN PATENT DOCUMENTS

| 2169938 | 6/1990 | Japan | 250/453.11 |
|---|---|---|---|
| 2182656 | 6/1990 | Japan | 250/453.11 |
| 4-61220 | 2/1992 | Japan | 250/453.11 |
| 4-71215 | 3/1992 | Japan | 250/453.11 |

Primary Examiner—Michael L. Gellner
Assistant Examiner—D. P. Malley
Attorney, Agent, or Firm—Fitzpatrick, Cella, Harper & Scinto

[57] ABSTRACT

A substrate supporting apparatus designed so that a substrate received and delivered by the apparatus can be positioned easily with improved accuracy. For this positioning, pressurized air is supplied between a float chuck and a base chuck of the substrate supporting apparatus to float the float chuck, and peripheral end surfaces of the float chuck are supported by cylinder pins and fixing pins. In this state, a substrate is received from a transport hand and is attracted to a surface of the float chuck. Thereafter, the cylinder pins are caused to recede, and the float chuck is moved together with the substrate by pressing forces of pressing springs to abut reference pins. As a result, a changeover valve is operated by output signals from photosensors to attract the float chuck to the base chuck.

22 Claims, 6 Drawing Sheets

101a
101

201d 201c 201a 201a 201a 201
201f
W
201e 201b 201b 202

APPARATUS AND METHOD FOR SUPPORTING A SUBSTRATE

This application is a continuation of application Ser. No. 08/013,088 filed Feb. 3, 1993, now abandoned.

BACKGROUND OF THE INVENTION

1. Field of the Invention

This invention relates to an apparatus for supporting a substrate formed of a silicon wafer or the like to be exposed and, more particularly, to a substrate supporting unit detachably attached to an exposure apparatus and arranged to receive and deliver a wafer substrate or the like at a position remote from the exposure apparatus.

2. Description of the Related Art

Generally, in exposure apparatuses for manufacturing semiconductor devices, a substrate supporting unit detachable from the exposure apparatus is provided. The substrate supporting unit is used to receive and deliver a wafer substrate or the like (hereinafter referred to simply as "substrate") by being transported between positions on the inside and the outside of the exposure apparatus.

That is, as shown in FIG. 7, a substrate W extracted from a substrate storage rack R is transported to a rotating transport hand H to a delivery position on an attraction plate 51 of a substrate supporting unit A. After receiving the substrate W under the transport hand H, the substrate supporting unit A is operated to position the substrate W relative to the attraction plate 51 and is transported to an exposure apparatus S.

FIGS. 8 and 9 show an example of such a conventional substrate supporting unit. An attraction plate 51 which is a main body of the substrate supporting unit has attraction grooves 51a formed in its surface to attract a substrate W by a vacuum. The attraction grooves 51a communicate, through an internal piping 51b, with a pressure controller which includes a vacuum pump and a pressurized air supply source. Positioning for adjusting the position of the substrate W relative to the attraction plate 51 is performed by a first positioning means consisting of a pair of reference pins 66a and 66b fixed on the attraction plate 51 close to one of two opposite first sides of the same and a pressing pin 62 disposed close to the other of the two opposite first sides, and by a second positioning means consisting of a reference pin 72 fixed on the attraction plate 51 close to one of two opposite second sides perpendicular to the two opposite first sides and a pressing pin 69 disposed close to the other of the two opposite second sides.

For this positioning operation, a vacuum attraction force acting through the attraction grooves 51a is first removed and pressurized air is then supplied to make the substrate float on the attraction plate 51. Thereafter, operating pressures in cylinders 62b and 69b which have maintained the pressing pins 62 and 69 in a retracted state against the pressing resilience forces of springs 62a and 69a, respectively, are removed. The pressing pins 62 and 69 released from the operating pressures of the cylinders 62b and 69b, respectively, are moved in the directions of the arrows shown in FIG. 8 by the forces of the springs 62a and 69a until the substrate W is brought into abutment against the reference pins 66a, 66b, and 72.

After the substrate W has been positioned in this manner, the vacuum attraction force is supplied again to act through the attraction grooves 51a so that the substrate W is attracted to the attraction plate 51. While the substrate W is maintained in this state, the substrate supporting unit A is transported into the exposure apparatus S. In the exposure apparatus S, the substrate W is irradiated with radioactive rays such as g-rays, i-rays, excimer laser light, and X-rays to transfer a semiconductor circuit pattern on the substrate W to a semiconductor substrate, a liquid crystal panel, or the like. A semiconductor device, a liquid crystal panel or the like is thereby manufactured.

In the above-described conventional process, however, the upper surface of the attraction plate is finished so as to be specular, having the effect of correcting the flatness of the substrate, and the substrate to be attracted is a thin plate having two surfaces also finished so as to be specular. For this reason, when the vacuum attraction force through the attraction grooves is removed and, conversely, pressure size air is jetted to float the substrate on the attraction plate after the substrate has been received from the transport hand, a phenomenon of local linking (adhesion) between the surfaces of the attraction plate and the substrate made specular as described above can occur easily, whereby the substrate is deformed so that the substrate cannot suitably float. In such a situation, positioning of the substrate on the attraction plate using the pressing pins cannot be performed smoothly, and there is a risk of the substrate and the reference pins being damaged by a collision therebetween and there is a risk of abrasion of the surface of the attraction plate. Also, the amount of dust thereby caused to land on the substrate may be so large that a transfer defocus occurs.

If an impurity is mixed in the pressurized air for floating the substrate, there is a risk of the substrate being contaminated. Further, since the substrate is pressed against each reference pin in a horizontal direction as shown in FIG. 9, the pressing resilience force of each pressing pin may impede the vacuum attraction of the substrate to the attraction plate after the positioning operation, if it is excessively large relative to the force of the vacuum attraction force of the attraction plate. Conversely, if the resilience force is excessively small, the pressing force of the pressing pin may be insufficient to maintain the desired positioning accuracy. Thus, a high degree of accuracy is required in adjusting the pressing resilience forces of the springs.

SUMMARY OF THE INVENTION

In view of the above-described problems, an object of the present invention is to provide an apparatus and a method for supporting a substrate so that the substrate can be positioned easily with improved accuracy without being deformed and without any damage to the reference pins and the attraction surface of the attraction plate.

It is another object of the present invention to overcome the problems of the prior art.

It is still another object of the present invention to provide an apparatus and method for supporting the substrate while minimizing the risk of contaminating the substrate with dust.

It is another object of the present invention to provide an apparatus and method for supporting a substrate so as to reduce the risk that sufficient dust will land on the substrate so that a transfer defocus occurs.

It is another object of the present invention to provide an apparatus and method for supporting a substrate which reduces the risk of a collision between the substrate and reference pins which could damage these elements.

It is still another object of the present invention to provide an apparatus and method for supporting a substrate in which the pressing resilience force of pressing pins does not impede the vacuum attraction of the substrate to an attraction plate after a positioning operation.

It is another object of the present invention to provide an apparatus and method for supporting a substrate so that the pressing force of pressing pins is sufficient to maintain the desired positioning accuracy.

According to one aspect, the invention which achieves at least one of these objectives relates to an apparatus for supporting a substrate comprising an attraction plate for attracting a substrate, a base plate on which the attraction plate is detachably mounted, force producing means for producing a vacuum attraction force attracting the attraction plate and the base plate to each other, moving means for moving the attraction plate relative to the base plate, and substrate position detection means for detecting the completion of the movement of the substrate attracted to the attraction plate to a predetermined position with respect to the base plate. A vacuum attraction force is started to be produced by the force producing means on the basis of an output from the substrate position detection means.

The force producing means can include a plurality of holes formed in at least one of the base plate and the attraction plate, an internal piping communicating with the holes, and an evacuation line detachably connected to the internal piping. When the moving means moves the attraction plate and the base plate relative to each other, pressurized air for separating the attraction plate and the base plate is supplied between the attraction plate and the base plate.

According to another aspect, the present invention which achieves one of these objectives relates to a method of supporting a substrate comprising the steps of attracting and supporting a substrate with an attraction plate movably supported on a base plate, moving the attraction plate relative to the base plate so that the substrate is set in a predetermined position, and attracting the attraction plate to the base plate with a vacuum attraction force after detecting with a sensor the completion of setting the substrate in a predetermined position.

According to still another aspect, the present invention which achieves one of these objectives relates to an exposure method comprising the steps of attracting and supporting an original plate with an attraction plate movably supported on a base plate, moving the attraction plate relative to the base plate so that the original plate is set in a predetermined position, attracting the attraction plate to the base plate with a vacuum attraction force after detecting with a sensor the completion of setting the original in the predetermined position, and transferring a pattern on the original plate to a semiconductor substrate by illuminating the original plate.

While the attraction plate is separated from the base plate, a substrate introduced by a transport hand or the like is attracted to a surface of the attraction plate. Then, the attraction plate is moved in a predetermined direction by driving of the drive means together with the substrate attracted to the surface thereof. When the substrate moving with the attraction plate reaches a predetermined position on the base plate, the substrate position detection means detects this state and an evacuation process is thereby started so that the attraction plate is attracted to the base plate.

The present invention has advantages described below.

The substrate is positioned in such a manner that the attraction plate to which the substrate is attracted is moved by being floated on the base plate. Therefore, there is no possibility of the attracted surfaces being damaged by abrasion and there is no risk of the substrate being deformed by linking or the like. Also, application of a large impact to reference pins can be prevented, and the substrate can be positioned easily with improved accuracy. Moreover, even in a case of using pressurized air, there is no risk of the substrate surface being thereby contaminated.

DESCRIPTION OF THE PREFERRED EMBODIMENTS

Figure 1:
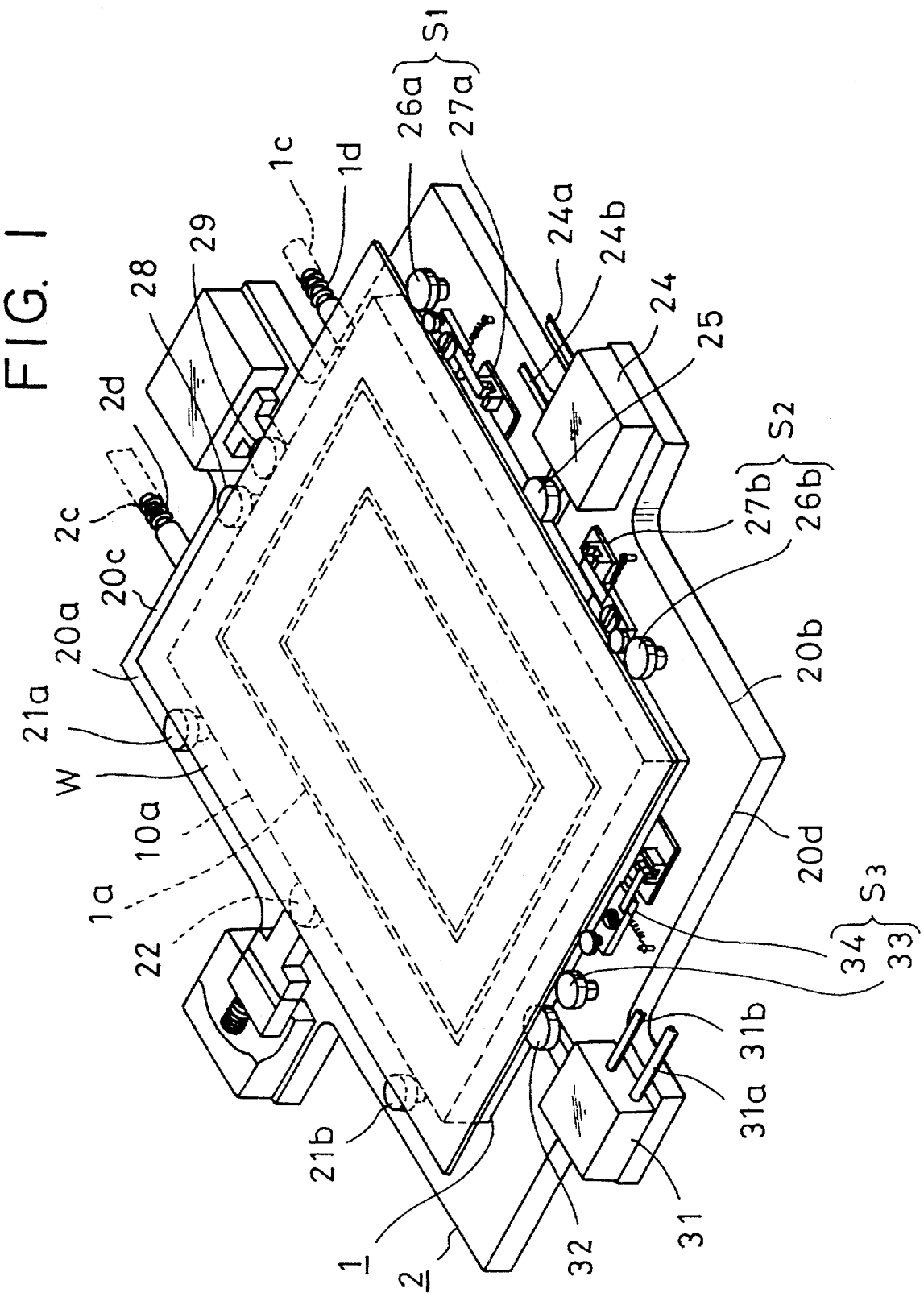
FIG. 1 is a perspective view of a first embodiment of the present invention.
Figure 7:
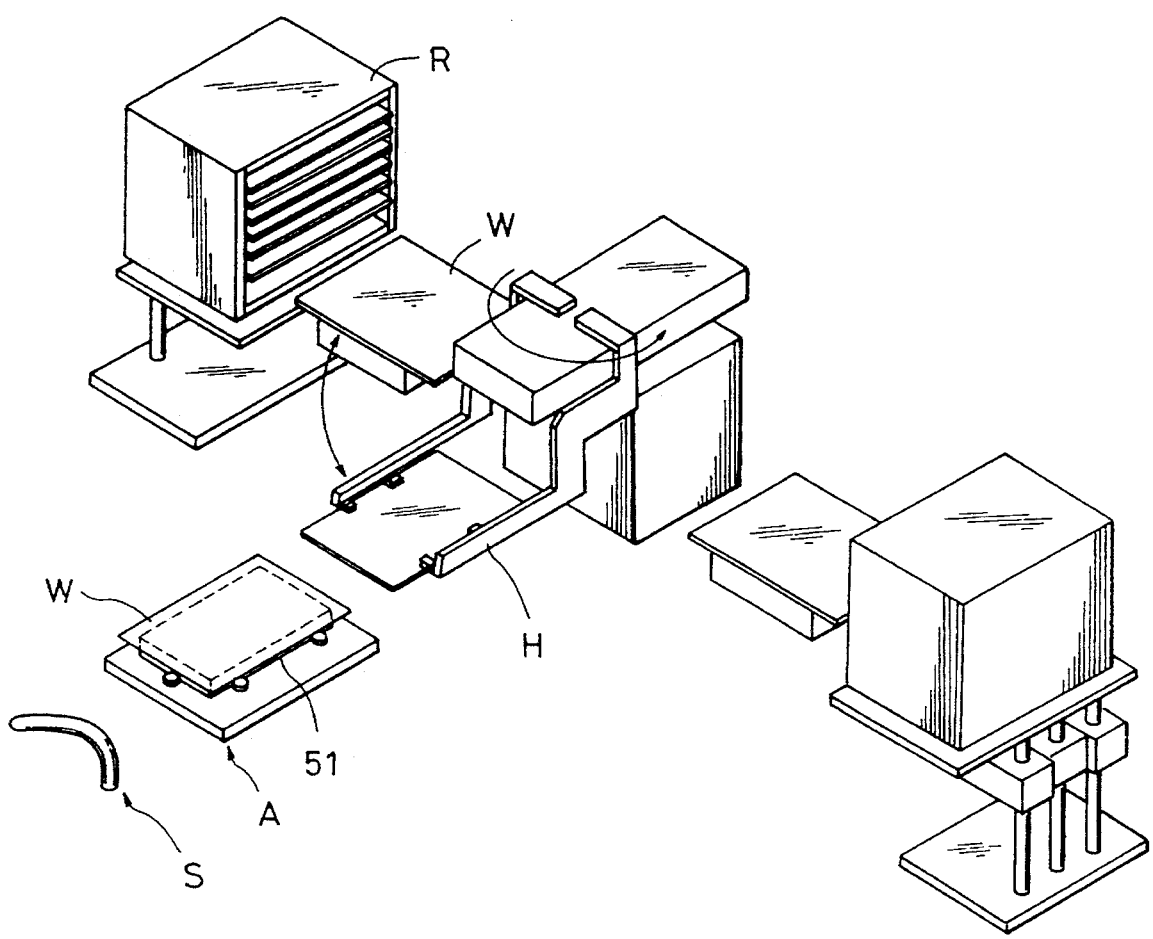
FIG. 7 is a diagram of showing the relationship between a substrate transporting unit, a transport hand, and an exposure apparatus.
Figure 8:
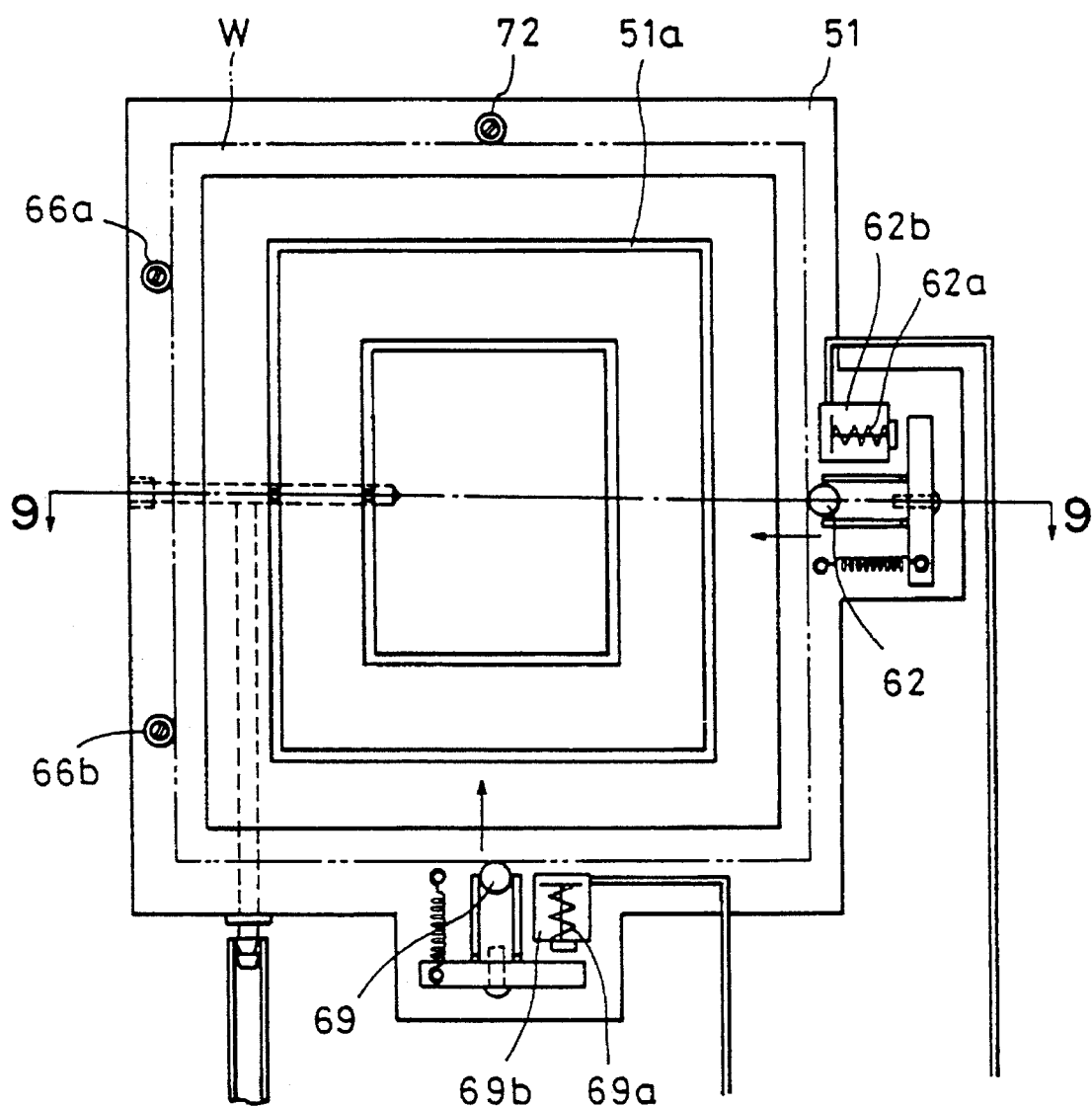
FIG. 8 is a schematic plan view of a conventional substrate transporting unit.
Figure 9:
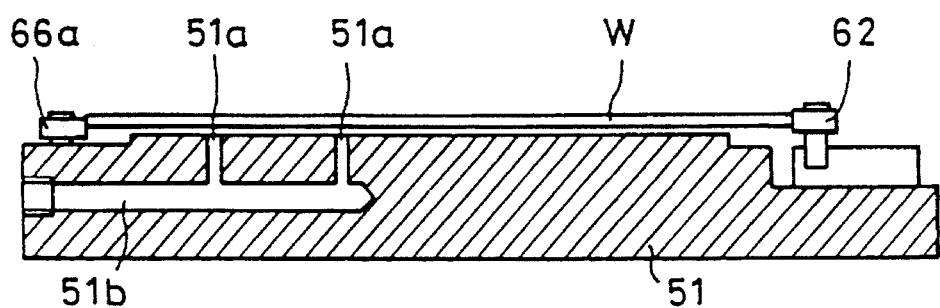
FIG. 9 is a cross-sectional view taken along the line B—B of FIG. 8.

FIG. 1 is a perspective view of a first embodiment in which the present invention is applied to an exposure apparatus such as that illustrated in FIG. 7. A float chuck 1 which is an attraction plate of a substrate supporting unit in accordance with this embodiment has a plurality of attraction grooves 1a formed in its surface. The attraction grooves 1a are formed so as to communicate with an internal piping 1b (shown in FIG. 2), and a substrate attraction evacuation line 1c (shown in FIG. 2) is detachably connected to the internal piping 1b through a nipple 1d.

Figure 2:
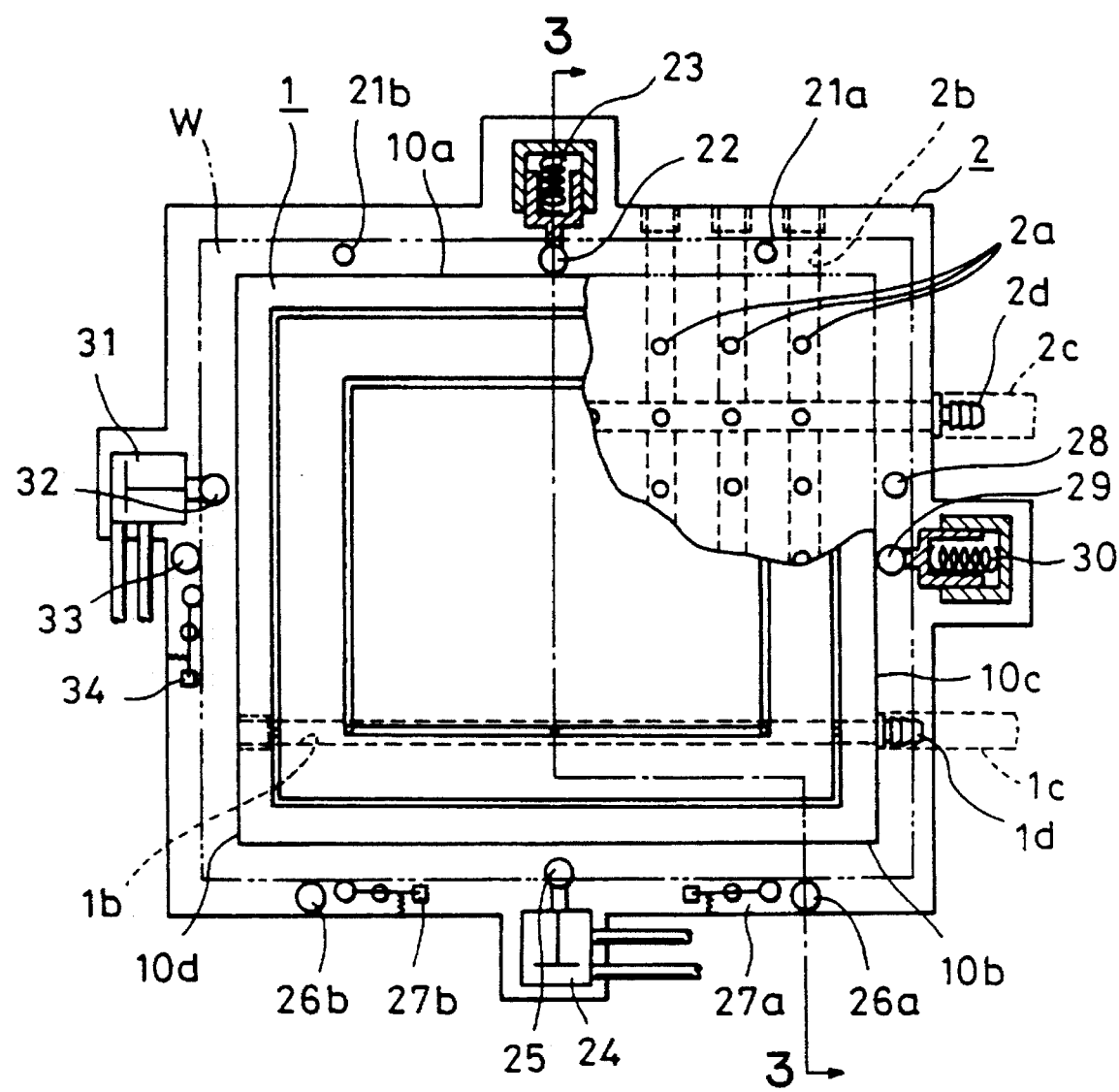
FIG. 2 is a schematic plan view of the first embodiment partly in section.
Figure 3:
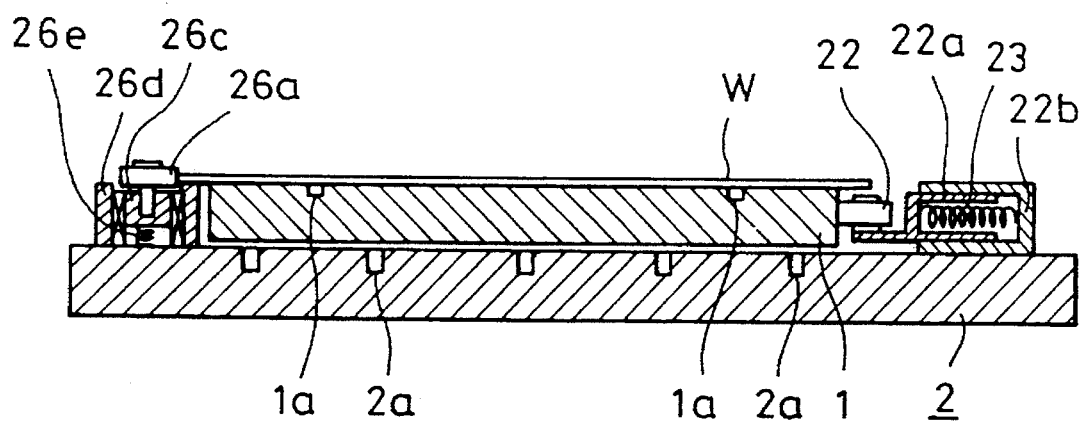
FIG. 3 is a cross-sectional view taken along the line A—A of FIG. 2.

The float chuck 1 is supplied with a vacuum attraction force through the evacuation line 1c to attract a substrate W to its surface. A base chuck 2 which is a plate on which the float chuck 1 is mounted has, as shown in FIGS. 2 and 3, evacuation/supply means, i.e., a plurality of holes 2a formed so as to open toward the lower surface of the float chuck 1, and an internal piping 2b communicating with the holes 2a. An evacuation/supply line 2c for attracting or floating the float chuck 1 is detachably attached to the internal piping 2b through a nipple 2d. The evacuation/supply line 2c communicates with a vacuum source and a pressurized air supply source through a changeover valve (not shown) provided as a changeover means.

The float chuck 1 is attracted to or floated on the surface of the base chuck 2 by a vacuum attraction force or pressurized air supplied from the evacuation/supply line 2c.

A pair of fixing pins 21a and 21b are provided on the base chuck 2 close to a side 20a of the base chuck 2. The fixing pins 21a and 21b are fixed to the base chuck 2. A pressing pin 22 provided as a drive means is disposed between the fixing pins 21a and 21b. The pressing pin 22 is pressed against a side 10a of the float chuck 1 by a spring 23. First and second substrate position sensor assemblies S1 and S2 and a cylinder 24 are provided on the base chuck 2 at a side 20b opposite to the side 20a. The cylinder 24 reciprocatingly moves a cylinder pin 25 by pressurized air alternately supplied from pipings 24a and 24b.

Each of the substrate position sensor assemblies S1 and S2 comprises a reference pin 26a or 26b engagable with a side of the substrate W attracted by the float chuck 1 and a photosensor 27a or 27b.

A fixing pin 28 and a pressing pin 29 which is a drive means pressed against a side 10c of the float chuck 1 by a spring 30 are provided on the base chuck 2 at a side 20c. Sides 20c and 20d are two opposite sides perpendicular to opposite sides 20a and 20b. These pins 28 and 29 are the same as the fixing pins 21a and 21b, and the pressing pin 2, respectively.

A cylinder 31 which is the same as the cylinder 24 and a third substrate position sensor assembly S3 which is the same as the first or second substrate position sensor assembly S1 or S2 are provided at the other side 20d of the base chuck 2. The cylinder 31 has a cylinder pin 32 which is the same as the cylinder pin 25, and the third substrate position sensor assembly comprises a reference pin 33 which is the same as the reference pin 26a or 26b, and a photosensor 34 which is the same as the photosensor 27a or 27b. The cylinder 31 reciprocatingly moves the cylinder pin 32 by pressurized air alternately supplied from pipings 31a and 31b.

The operation of this embodiment will be described below.

When the substrate W is received from the transport hand, pressurized air is first jetted through holes 2a of the base chuck 2 to float the float chuck 1. Then, the cylinders 24 and 31 are driven to press the respective cylinder pins 25 and 32 against corresponding sides 10b and 10d of the float chuck 1, thereby moving the float chuck 1 toward the fixing pins 21a, 21b, and 28. As the sides 10a and 10c of the float chuck 1 opposite to the 10b and 10d are brought close to the fixing pins 21a, 21b, and 28, the pressing pins 22 and 29 engaging the sides 10a and 10c recede by moving against the springs 23 and 30, respectively. That is, the float chuck 1 floats on the base chuck 2 and receives the substrate W from the transport hand while its peripheral sides are being supported by the cylinder pins 25 and 32 and the fixing pins 21a, 21b, and 28. The substrate W is attracted to the surface of the float chuck 1 by the vacuum attraction force acting through the attraction grooves 1a.

Next, the cylinders 24 and 31 are driven in the reverse direction so that the cylinder pins 25 and 32 recede from the sides 10b and 10d of the float chuck 1. With this movement, the pressing pins 22 and 29 engaging the opposite sides 10a and 10c move the float chuck 1 in the direction opposite to the direction of the above-described movement of the float chuck 1 by the restoring forces of the springs 23 and 30.

That is, the floating chuck attracting the substrate W is moved toward the reference pins 26a, 26b and 33 by the pressing forces of the pressing pins 22 and 29.

When the substrate W is brought into engagement with the reference pins 26a, 26b, and 33, the changeover valve of the evacuation/supply line 2c is operated in response to outputs from the photosensors 27a, 27b, and 34 so that the internal piping 2b of the base chuck 2 is disconnected from the pressurized air supply source and connected to the vacuum source. The float chuck 1 is then attracted by the vacuum attraction force acting through the holes 2a. That is, the float chuck 1 and the base chuck 2 are integrally connected to each other by the vacuum attraction force.

Finally, after it has been confirmed with the photosensors 27a, 27b, and 34 that the substrate W is placed in the predetermined position, and after it has been confirmed that the vacuum attraction force of each of the float chuck 1 and the base chuck 2 is sufficiently large with confirmation means, the substrate supporting unit is transported to the exposure apparatus along with the substrate W, while the evacuation line 1c and the evacuation/supply line 2c are connected to the substrate supporting unit.

Since the substrate received from the transport hand is positioned while the substrate is attracted to the float chuck, the floating force of the pressurized air does not act on the substrate directly and, therefore, there is no risk of the occurrence of a deformation or of contamination of the substrate. Also there is no risk of abrasion of the surface of the float chuck attracting the substrate, when the substrate is positioned.

Details of the pressing pin 22, the reference pin 26a and the photosensor 27a will now be described below.

As shown in FIG. 3, the pressing pin 22 and a slider 22a are provided as one united member. The slider 22a is slidably inserted in a housing 22b fixed on the base chuck 2. The spring 23 is disposed between the housing 22b and the slider 22a to press the slider 22 toward the center of the base chuck 2. The pressing pin 22 integral with the slider 22a is thereby pressed toward the center of the base chuck 2. The pressing pin 29 is the same as the pressing pin 22 and will not be separately described.

The reference pin 26a is fixed by being screwed into a supporting member 26c which is slidably inserted in a housing 26d fixed on the base chuck 2. A spring 26e is disposed between the housing 26d and the supporting member 26c. When the vacuum attraction force is applied to the base chuck 2 after the float chuck 1 has been pressed back by the pressing pin 22 so that one side of the substrate W engages the reference pin 26a, the reference pin 26a is moved together with the substrate W so as to be closer to the base chuck 2 while compressing the spring 26e. Therefore there is no possibility of the occurrence of sliding friction between the contact surfaces of the reference pin 26a and the substrate W. Each of the other reference pins 26b and 33 is the same as the reference pin 26e and will not be separately described.

If each of the reference pins 26a, 26b, and 33 is formed of a resin having a small frictional factor, the above-described loose spring mechanism is not always necessary.

Figure 4:
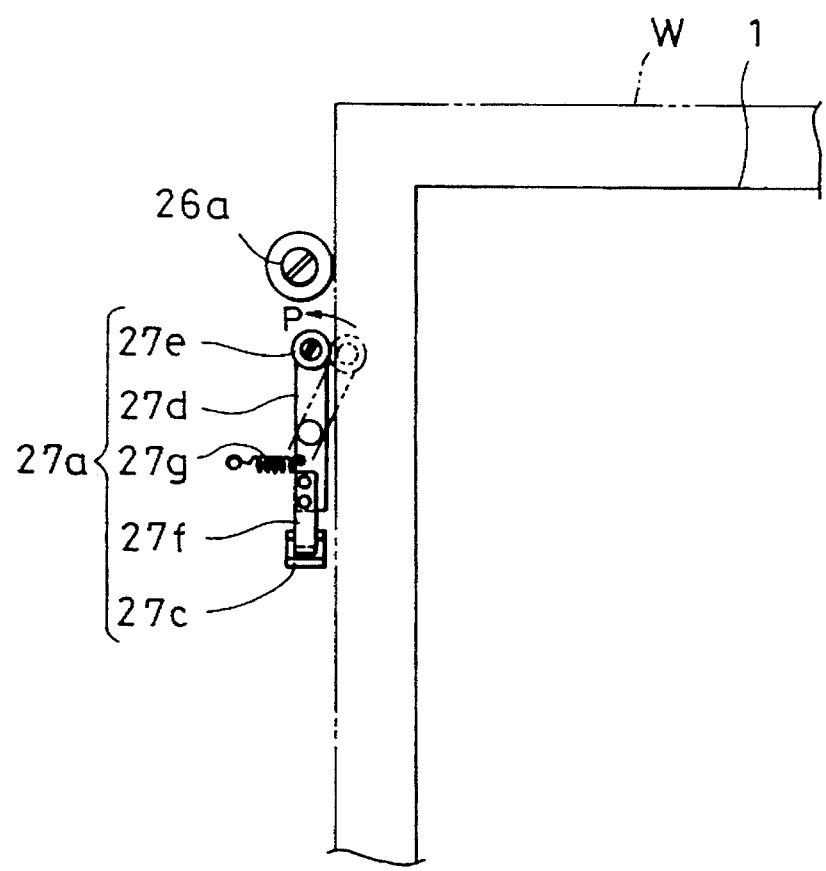
FIG. 4 is a schematic diagram of a photosensor.

As shown in FIG. 4, the photosensor 27a comprises a light receiving device 27c fixed on the base chuck 2 and an arm 27d having a central portion pivotally supported on the base chuck 2. The photosensor 27a also comprises a roll 27e supported on one end portion of the arm 27d, a shading plate 27f supported on the other opposite end portion of the arm 27d, and a spring 27g. One end of the spring 27g is attached to the base chuck 2 and the other end of the spring 27g is attached to the arm 27d. As the substrate W is brought closer to the reference pin 26a, the roller 27e is pressed to move from the position indicated by the dotted line to the position indicated by the solid line in FIG. 4, while the arm 27d is pivotally moved in the direction of arrow P against the force of the spring 27g.

The arrival of one side end of the substrate W at the reference pin 26a is detected by a signal output from the light receiving device 27c when light traveling to the light receiving device 27c is cut off by the shading plate 27f. The other photosensors 27b and 34 are the same as the photosensor 27c and will not be separately described.

Figure 5:
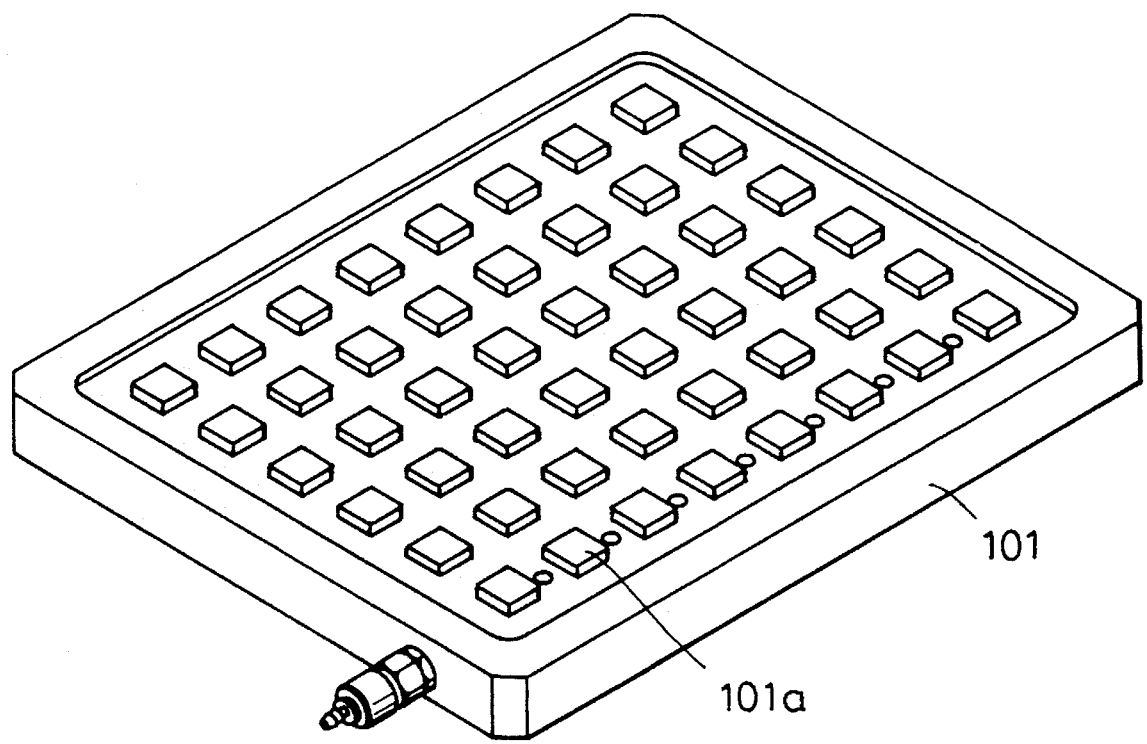
FIG. 5 is a perspective view of an example of a modification of the float chuck.

FIG. 5 shows an example of a modification of the float chuck. A float chuck 101 shown in FIG. 5 has a plurality of projections 101a formed in the surface on which the substrate is placed so that the area of contact with the substrate is minimized, whereby the possibility of extraneous matter or dust being pressed between the substrate and the floating chuck surface is reduced and the occurrence of linking is prevented. Also, the time for vacuum cancellation is thereby reduced, so that the substrate can be attached and detached quickly.

Figure 6:
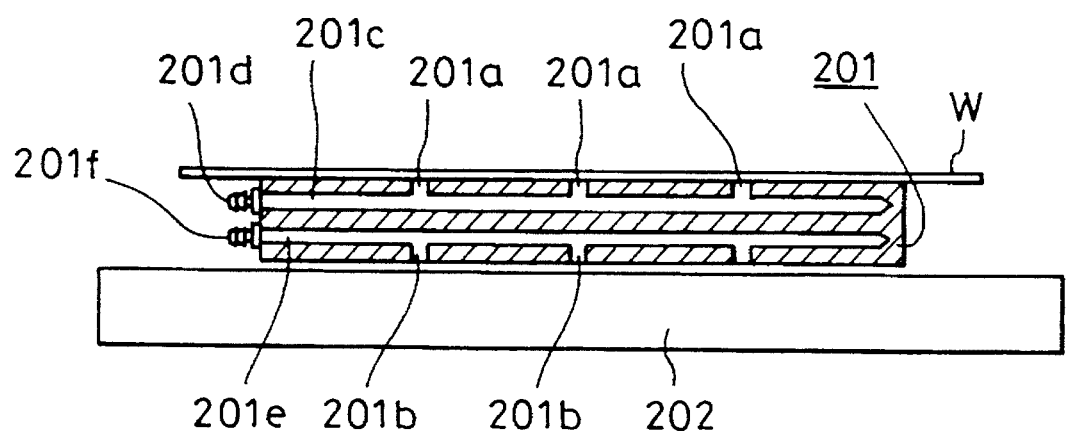
FIG. 6 is a cross-sectional view of a portion of a second embodiment of the present invention.

FIG. 6 is a schematic cross-sectional view of a second embodiment of the present invention. A float chuck 201 in accordance with the second embodiment has a plurality of attraction grooves 201a formed in one of its two surfaces to attract a substrate W by a vacuum, and holes 201b formed in the other surface thereof so as to face a base chuck 202. An internal piping 201c communicating with the attraction grooves 201a is connected to an evacuation line (not shown) through a nipple 201d, and an internal piping 201e communicating with the holes 201b is connected through a nipple 201f to an evacuation/supply line (not shown) having a changeover valve.

The substrate W is attracted to the surface of the float chuck 201 by a vacuum attraction force supplied through the nipple 201d. At this time, the float chuck 201 is floated on the base chuck 202 by pressurized air supplied through the nipple 201f and jetted through the holes 201b of the float chuck 201.

The substrate W is positioned by the same positioning means as those of the first embodiment, i.e., the pressing pins, the substrate position sensor assemblies, and so on, and the changeover valve of the evacuation/supply line is operated to supply the vacuum attraction force instead of the pressurized air, thereby attracting the float chuck 201 to the surface of the base chuck 202.

In this embodiment, the size of float chuck 201 is reduced relative to that of the base chuck 202, so that the structure forming the internal pipings for floating and attracting the float chuck can be reduced in size or simplified. The components other than the float chuck 201 and the base chuck 20 are the same as those of the first embodiment, and the description thereof will not be repeated.

It is possible to use a cylinder operated by pressurized air in place of the spring for pressing each pressing pin. In such a case, the pressure of pressurized air supplied to each cylinder may be controlled to adjust the pressing force of the pressing pin. Also, the times for driving the pressing pins may be shifted from each other by selecting the timing of supplying pressurized air so that the float chuck moves rectilinearly along two axes perpendicular to each other.

It is preferable to select a light-weight ceramic as the material for the float chuck 1 by considering the weight and the rigidity thereof in relation to the material of the substrate, which is glass.

While the present invention has been described with respect to what presently are considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An apparatus for supporting a substrate, comprising:

an attraction plate comprising an attracting mechanism producing a force attracting a substrate;

a base plate on which said attraction plate is detachably mounted;

force producing means for producing a vacuum attraction force attracting said attraction plate and said base plate to each other;

moving means for moving said attraction plate relative to said base plate to move the substrate to a predetermined position when said substrate is attracted to said attraction plate; and substrate position detection means for detecting the completion of the movement of said substrate attracted to said attraction plate to a predetermined position with respect to said base plate, whereupon a vacuum attraction force is started to be produced by said force producing means on the basis of an output from said substrate position detection means.

2. An apparatus according to claim 1, wherein said force producing means includes a plurality of holes formed in at least one of said base plate and said attraction plate, an internal piping communicating with the holes, and an evacuation line detachably connected to the internal piping.

3. An apparatus according to claim 1, further comprising a source of pressurized air, wherein, when said moving means moves said attraction plate and said base plate relative to each other, said source of pressurized air supplies pressurized air for separating said attraction plate and said base plate between said attraction plate and said base plate.

4. A method of supporting a substrate, comprising the steps of:

attracting and supporting a substrate with an attraction plate movably supported on a base plate;

moving the attraction plate relative to the base plate to position the substrate in a predetermined position; and attracting the attraction plate to the base plate with a vacuum attraction force after detecting with a sensor the completion of moving the substrate to the predetermined position.

5. An exposure method comprising the steps of:

attracting and supporting a substrate with an attraction plate movably supported on a base plate;

moving the attraction plate relative to a base plate to position the substrate in a predetermined position;

attracting the attraction plate to the base plate with a vacuum attraction force after detecting with a sensor the completion of moving the substrate to the predetermined position; and transferring a pattern on the substrate to a semiconductor substrate by illuminating the substrate.

6. The apparatus according to claim 1, wherein said moving means moves said attraction plate relative to said base plate in a plane perpendicular to the direction of the vacuum attraction force.

7. The apparatus according to claim 1, further comprising a floating mechanism for floating said attraction plate on said base plate when said moving means moves said attraction plate.

8. The apparatus according to claim 7, wherein said moving means comprises a plurality of moving elements moving said attraction plate in a plane perpendicular to the direction of the vacuum attraction force.

9. The apparatus according to claim 8, wherein said plurality of moving elements comprises:

first and second moving elements, each comprising a cylinder reciprocatingly moving a cylinder pin adapted to engage a side of said attraction plate; and third and fourth moving elements each comprising a pressing pin adapted to engage a side of said attraction plate, and a spring adapted to press said pressing pin into engagement with a side of said attraction plate.

10. The method according to claim 4, wherein said moving step moves the attraction plate relative to the base plate in a plane perpendicular to the direction of the vacuum attraction force.

11. The method according to claim 4, further comprising the step of floating the attraction plate on the base plate when said moving step is performed.

12. The method according to claim 11, wherein said moving step comprises:

a first driving step for driving at least one cylinder to press a cylinder pin against a side of the attraction plate, thereby moving the attraction plate to displace at least one pressing pin engaging a side of the attraction plate against a spring so that the attraction plate is set in the predetermined position.

13. The method according to claim 12, wherein said driving step comprises the step of driving two cylinders to each press a cylinder pin against adjacent sides of the attraction plate to displace two pressing pins engaging two other adjacent sides of the attraction plate against respective springs.

14. The method according to claim 13, further comprising:

a second driving step for driving the two cylinders in a reverse direction to the direction the cylinders were driven in said first driving step, thereby moving the cylinder pins out of engagement with the sides of the attraction plate, and causing the springs to drive the pressing pins to move the attraction plate in a direction opposite to the direction of movement of the attraction plate in said first driving step until the attraction plate moves to the predetermined position.

15. The method according to claim 5, wherein said moving step moves the attraction plate relative to the base plate in a plane perpendicular to the direction of the vacuum attraction force.

16. The method according to claim 5, further comprising the step of floating the attraction plate on the base plate when said moving step is performed.

17. The method according to claim 16, wherein said moving step comprises:

a first driving step for driving at least one cylinder to press a cylinder pin against a side of the attraction plate, thereby moving the attraction plate to displace at least one pressing pin engaging a side of the attraction plate against a spring so that the attraction plate is set in the predetermined position.

18. The method according to claim 17, wherein said driving step comprises the step of driving two cylinders to each press a cylinder pin against adjacent sides of the attraction plate to displace two pressing pins engaging two other adjacent sides of the attraction plate against respective springs.

19. The method according to claim 18, further comprising:

a second driving step for driving the two cylinders in a reverse direction to the direction the cylinders were driven in said first driving step, thereby moving the cylinder pins out of engagement with the sides of the attraction plate, and causing the springs to drive the pressing pins to move the attraction plate in a direction opposite to the direction of movement of the attraction plate in said first driving step until the attraction plate moves to the predetermined position.

20. An apparatus according to claim 1, wherein said force producing means produces a vacuum attraction force directly applied between said attraction plate and said base plate.

21. A method according to claim 4, wherein said attraction plate attracting step comprises the step of directly applying a vacuum force between the attraction plate and the base plate.

22. A method according to claim 5, wherein said attraction plate attracting step comprises the step of directly applying a vacuum force between the attraction plate and the base plate.

* * * * *

UNITED STATES PATENT AND TRADEMARK OFFICE
CERTIFICATE OF CORRECTION

PATENT NO. : 5,471,279
DATED : November 28, 1995
INVENTOR(S) : TAKESHI TAKIZAWA

It is certified that error appears in the above-indentified patent and that said Letters Patent is hereby corrected as shown below:

ON THE COVER PAGE

[56] References Cited

FOREIGN PATENT DOCUMENTS

```
"2169938 6/1990 Japan
 2182656 6/1990 Japan"  should read
--2-169938    6/1990    Japan
  2-182656    7/1990    Japan--.
```

COLUMN 7

Line 39, "chuck 20" should read --chuck 202--.

Signed and Sealed this

Twenty-eighth Day of May, 1996

Attest:

BRUCE LEHMAN

*Attesting Officer*      *Commissioner of Patents and Trademarks*